United States Patent

Pierson et al.

[11] Patent Number: 5,912,583
[45] Date of Patent: Jun. 15, 1999

[54] CONTINUOUS TIME FILTER WITH PROGRAMMABLE BANDWIDTH AND TUNING LOOP

[75] Inventors: Richard C. Pierson, Dallas, Tex.; Srinivasan Venkatranan, Bangalore, India

[73] Assignee: Texas Instruments Incorporated, Dallas, Tex.

[21] Appl. No.: 09/000,826

[22] Filed: Dec. 30, 1997

[51] Int. Cl.$^6$ ...................................................... H02M 7/00
[52] U.S. Cl. ............................ 327/553; 327/563; 330/86; 330/282
[58] Field of Search ..................................... 327/362, 512, 327/513, 183, 551, 553, 555, 563; 330/107, 109, 306, 305, 86, 282

[56] References Cited

U.S. PATENT DOCUMENTS

| 5,404,058 | 4/1995 | Nishijima | 327/332 |
| 5,446,676 | 8/1995 | Huang et al. | 364/578 |
| 5,493,250 | 2/1996 | Kasperkovitz et al. | 327/563 |
| 5,510,738 | 4/1996 | Gorecki et al. | 327/103 |
| 5,553,008 | 9/1996 | Huang et al. | 364/578 |
| 5,625,317 | 4/1997 | Deveirman | 327/353 |
| 5,736,885 | 4/1998 | Wietecha et al. | 327/307 |

*Primary Examiner*—Kenneth B. Wells
*Assistant Examiner*—Hai L. Nguyen
*Attorney, Agent, or Firm*—W. Daniel Swayze, Jr.; Wade James Brady, III; Richard L. Donaldson

[57] ABSTRACT

A transconductor is provided having a transconductance $G_m$. This transconductance is then attenuated with a steering circuit (41) to attenuate the overall transconductance of the transconductor and vary the bandwidth. A fixed voltage is then input to the transconductor with the output thereof offset with a programmable current DAC (48). This output is then provided to an error amplifier (46) for developing an error voltage. This error voltage is then input back to the input of the transconductor to adjust the transconductance thereof to minimize this error. The steering circuit (41) is controlled by a voltage DAC (58) to program the attenuation provided thereby. Both the voltage DAC (58) and the current DAC (48) are controlled by a bandwidth control signal to program the bandwidth of the overall transconductor. This is facilitated while compensating for the process and temperature variations of the transconductance of the transconductor. This is also facilitated with a master/slave relationship.

2 Claims, 4 Drawing Sheets

CONTINUOUS TIME FILTER WITH PROGRAMMABLE BANDWIDTH AND TUNING LOOP

CROSS REFERENCE TO RELATED APPLICATIONS

This application is related to U.S. patent application Ser. No. 08/104,459, entitled "Filter Tuning Loop Enabling Filter Bandwidth to be Process and Temperature Independent".

TECHNICAL FIELD OF THE INVENTION

The present invention pertains in general to continuous time filters and, more particularly, to a continuous time filter having a transconductor element with the transconductance thereof programmable, with process variations and temperature variations compensated for.

BACKGROUND OF THE INVENTION

The use of continuous time filters that utilize one or more transconductor stages and having a bandwidth that is a function of the tranconductance $G_m$ of each of the stages is becoming more widespread. This $G_m$ value can vary as a result of process variations, temperature variations, etc. Consequently, the bandwidth can also vary as a result of these variations in process and temperature, up to 100% from the desired frequency. For some applications, the bandwidth itself must be programmable. This is typically achieved by varying the $G_m$ via some programmable device such as a digital-to-analog converter (DAC) which receives a digital program word and converts it to an analog program signal. This programming device typically has a nonlinear transfer function such that any compensation mechanism that compensates for process and temperature variations of the $G_m$ of a particular transconductor in the filter will be required to operate over the bandwidth of the device.

One prior art compensated transconductor element for use with a continuous time filter has associated therewith a transconductance portion for converting a differential input voltage to a differential current output. During a calibration cycle, an external programmable current source is utilized for inserting a predetermined amount of current into the output of the filter while a fixed voltage is provided to the input of the filter. The programmable input current is fixed such that when the transconductance of the transconductance is set, the effective current output will be at a "0" value. By comparing the actual output current value with the desired output value of "0", an error signal can be generated, which error signal is then utilized in a negative feedback loop to tune the transconductance of the transconductance element. Since the fixed input voltage and the programmable current source are fixed values, this provides a current/voltage relationship by which to determine the transconductance of the overall transconductor.

SUMMARY OF THE INVENTION

The present invention disclosed and claimed herein comprises an integrated circuit having a transconductor with a compensated transconductance therefor. The transconductor includes a differential transconductance element for receiving a differential input voltage on a differential input and outputting a differential current. A differential current load is provided for loading the output of the transconductance element. A programmable bandwidth element disposed between the transconductor element and the differential current load is operable to divert a portion of the current output by the transconductance element to an external source. This allows for the combination of the transconductance element and the programmable bandwidth element to provide an overall effective transconductance for the transconductor. A calibration circuit is provided for calibrating the effect of transconductance by providing a fixed voltage $V_{in}$ for being connected to and driving the differential input of the differential transconductance element. A fixed current source is then provided by the calibration circuit for outputting a current $I_F$ and a tuning circuit that adjusts the transconductance of the transconductance element as a function of the error voltage. This tuning is controlled by a control circuit to vary the transconductance of the transconductance element to adjust the overall effective transconductance to substantially $I_F/V_{in}$, such that variations in the effective transconductance due to variations in the differential transconductance element and the programmable bandwidth element are compensated for.

In another aspect of the present invention, the programmable bandwidth element provides a non-linear transfer function. This non-linear transfer function is disposed within the tuning loop provided by the calibration circuit, such that any non-linearities in the programmable bandwidth element are compensated for. Further, the current source is a programmable current source for selecting a level of $I_F$ in discreet levels. The programmable bandwidth element and the programmable current source are varied in tandem when changing the value of the programmable bandwidth element.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
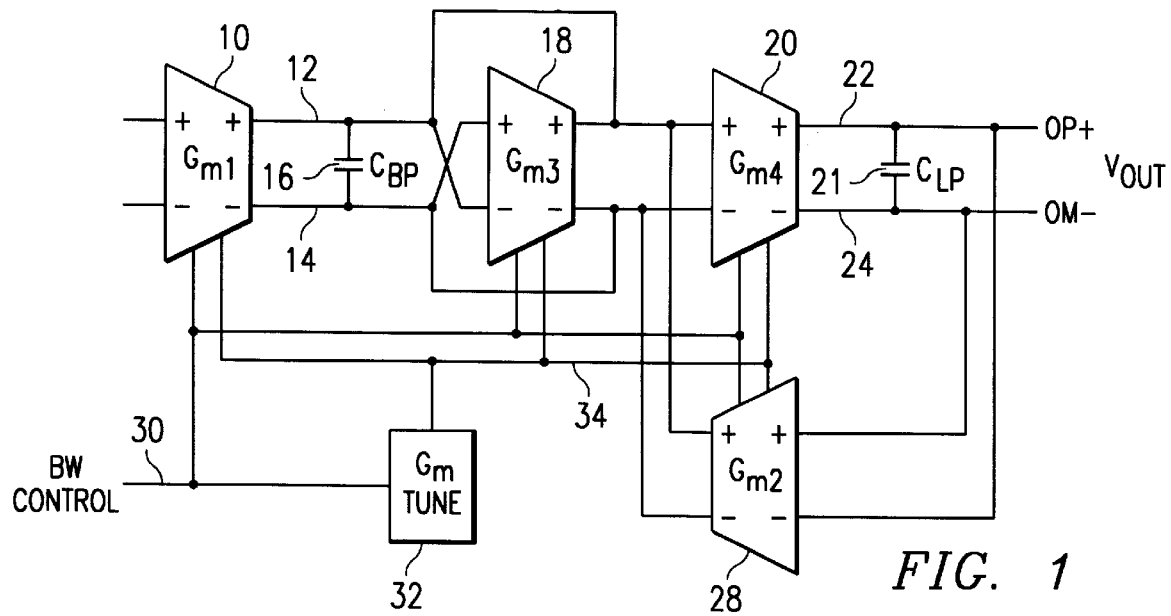
FIG. 1 illustrates a block diagram of a continuous time filter utilizing the fast tuning loop of the present invention.

Referring now to FIG. 1, there is illustrated a block diagram of a continuous time filter biquad stage utilizing transconductance. It should be noted that this filter configuration is by way of example and that other filter configurations could be utilized. In the filter of FIG. 1, there are illustrated four continuous time stages each utilizing a transcondutor, each having a gain associated therewith. A first input stage 10 has positive and negative inputs and positive and negative outputs, with a transconductance labeled $G_{m1}$. The positive output is connected to a line 12 and the negative output to a line 14. A capacitor 16 is disposed therebetween, the capacitor 16 labeled $C_{BP}$. The positive output of the stage 10 is input to the negative input of a second stage 18 with a transconductance $G_{m3}$, with the negative output of stage 10 input to the positive input of stage 18. The negative input of stage 18 is connected to the positive output thereof with the positive input of stage 18 also connected to the negative output thereof. The positive output of stage 18 is connected to the positive input of a stage 20 and the negative output of stage 18 connected to the negative input of stage 20. The positive output of stage 20 is connected to a positive output line 22 with the negative output thereof connected to a negative output line 24. A load capacitor 26 is connected between the positive and negative output lines 22 and 24, capacitor 26 labeled $C_{LP}$. The stage 20 has a transconductance $G_{m4}$. A feedback stage 28 has the positive input thereof connected to the negative output line 24 and the negative input thereof connected to the positive output line 22. The positive output of stage 28 is connected to the positive input of stage 20 and the negative output of stage 28 is connected to the negative input of stage 20.

Each of the stages 10, 18, 20 and 28 has a programmable bandwidth provided by a bandwidth control signal on a line 30. In addition, each of the stages 10, 18, 20 and 28 has the transconductance thereof tuned to compensate for process and temperature variations, which tuning tracks the bandwidth control signal. This is provided by a tuning block 32 which generates a bias signal on a line 34 for input to each of the stages 10, 18, 20 and 28. As will be described hereinbelow, this is a master/slave relationship with the master tuning provided by the tuning block 32 which, in effect, has a corresponding stage contained therein that will "track" the process and temperature variations of the stages 10, 18, 20 and 28. By compensating for these variations in the block 32, the control signal developed therefor will then be mirrored over to the stages 10, 18, 20 and 28.

Figure 2:
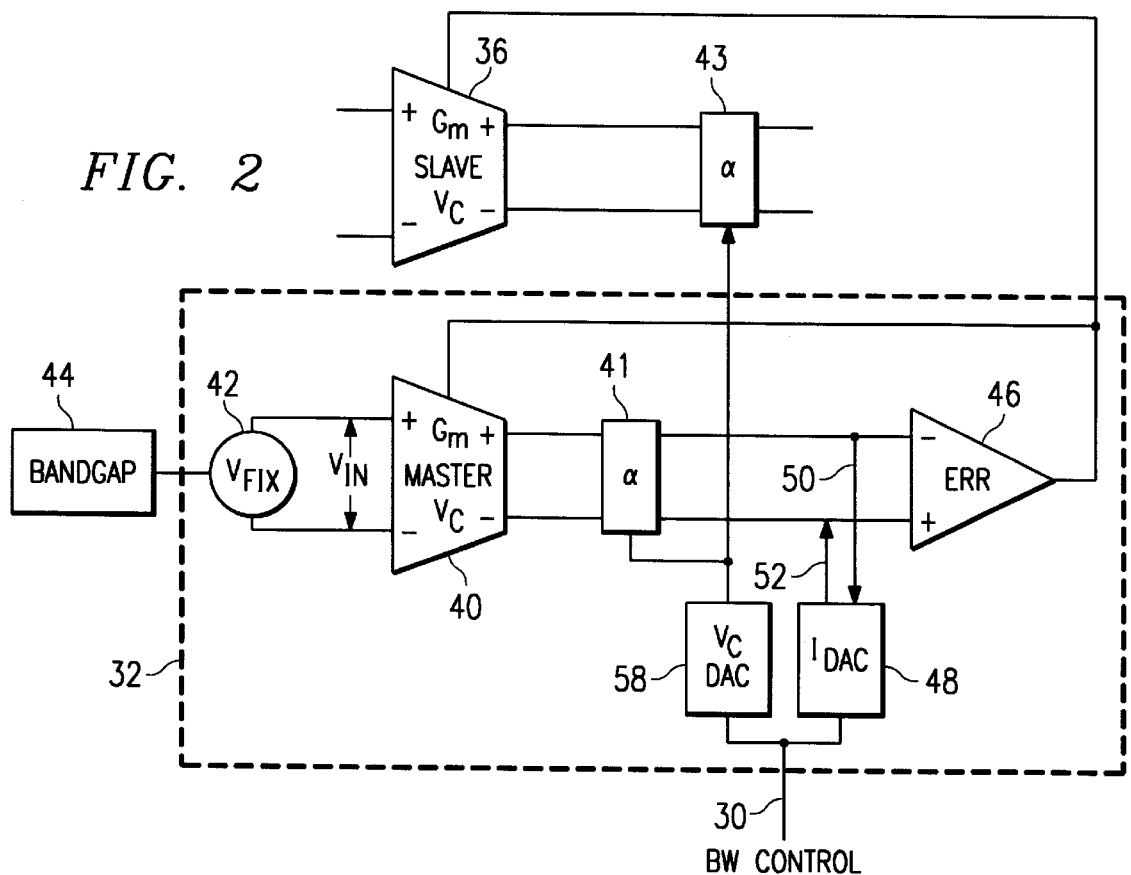
FIG. 2 illustrates a block diagram of the fast tuning loop in a master/slave configuration.

Referring now to FIG. 2, there is illustrated a block diagram of the tuning block 32 and one of the transconductor stages 10, 18, 20 and 28, referred to as a stage 36. The stage 36 is a slave stage, whereas the tuning block 32 has contained therein a master stage 40. The master stage 40 has a transconductance $G_m$ associated therewith with a positive and negative input and a positive and negative output. The positive and negative input of the master stage 40 is connected to a fixed voltage block 42 which provides a stable voltage that is derived from a band gap generator 44, which band gap generator 44 is fabricated on the same integrated circuit as the tuning block 32 and the slave stage 36. The output of the master stage 40 is connected to a programming element 41 for programming the bandwidth thereof, the output of which is connected to the positive and negative inputs of an error amplifier 46, such that the positive output of master stage 40 is connected to the negative input of error amplifier 46 and the negative output of the master stage 40 is connected to the positive input of the error amplifier 46. A programming element 43, identical to programming element 41, is connected to the output of the slave stage 36.

Since there is a finite voltage on the input to the master stage 40, the output current thereof would have a relationship with respect to the input voltage that is a function of the transconductance $G_m$. This is defined by the following equation:

$$G_m = \frac{d\,I_{out}}{d\,V_c}$$

Where $I_{out} = \Delta I + - \Delta I -$.

Without some modification, this, of course, will result in a large error. However, a programmable current source 48 is provided for removing current from the positive output through a line 50 and inserting current into the negative output of the master stage 40 through a line 52. As such, the programmable current source 48 comprises a set of current sources for sinking current from the positive output of master stage 40 to ground, and a set of current sources for sourcing current to the negative output of the master stage 40 from the positive rail of the integrated circuit. This set of current sources for each of the positive and negative outputs of the master stage 40 are selectable by the bandwidth control signal on line 30. In general, these current sources are derived from a reference current that is referenced to the band gap generator and an external resistor. Since the voltage $V_{in}$ provided by the block 42 will result in a difference in current on the output of the master stage 40, in order to have a "0" voltage disposed between the positive and negative outputs of the error amplifier 46, it is only necessary to compensate for this current imbalance with the programmable current source 48 (assuming no process and temperature variations). Once the input voltage is set and the current level of current source 48 is set, an ideal situation would result in a "0" voltage between the positive and negative outputs and, subsequently, a "0" output from the error amplifier 46. However, if there some differences in the $G_m$ of the master stage 40 as a result of process or temperature variations, this will result in an error, which is fed back to the master stage 40 from the output of the error amplifier 46 to adjust the $G_m$ therein. This error signal or tuning signal is also input to the slave stage 36. It can be seen, of course, that the tuning operation requires some fixed input to the master stage 40 and, as such, the master stage 40 could not be utilized for signal processing during the tuning operation. Therefore, by utilizing a master/slave relationship, the tuning can be determined with the master stage 40 and this tuning mirrored over to the slave stage 36. Of course, this assumes that the process or temperature variations in the master and slave are substantially identical. This would hold true, of course, when the master and slave stages are formed on the same integrated circuit substrate.

In addition to the programmable current source 48, there is also provided a programmable DAC 58 for providing a programmable voltage $V_c$ which provides a bandwidth programming operation to the master stage 40 and the slave stage 36. This programming voltage is a function of the bandwidth control signal on line 30, which is basically a digital program word. As such, when the bandwidth is varied, the current source 48 will also be changed. This will be described in more detail hereinbelow.

Figure 3:
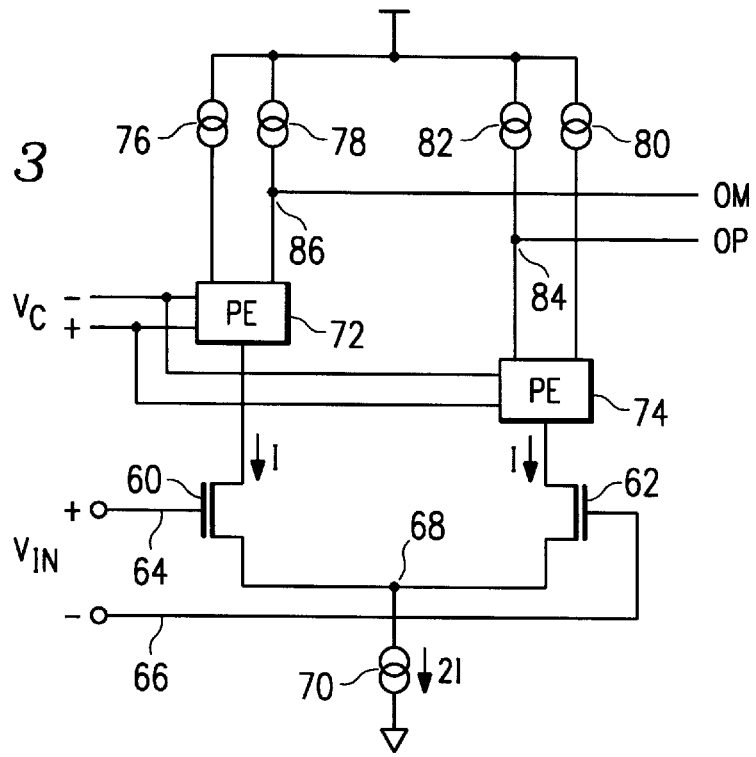
FIG. 3 illustrates a diagrammatic view of the programmable transconductor.

Referring now to FIG. 3, there is illustrated a schematic representation of a single continuous filter stage utilizing a transconductor. Differential N-channel MOS transistors 60 and 62 are provided with the sources thereof connected to a common source node 68 and the gates thereof connected to positive and negative input terminals 64 and 66, which have a voltage $V_{in}$ impressed thereacross, this being the fixed input voltage to the stage. The common source node 68 is connected to one side of a current source 70, the other side thereof connected to ground, the current source 70 having a current of 2I provided therefor.

The drain of transistor 60 is connected to a programming element 72 and the drain of transistor 62 is connected to a programming element 74. The programming element 72 is a steering device which is operable to steer current between two current source loads 76 and 78. Similarly, the programming element 74 is operable to steer current between two current sources 80 and 82. The output of the stage is comprised of a positive current output from a node 84 and a negative current output on a node 86. The programming elements 72 and 74 allow for changing the bandwidth of the transconductor.

In operation, the programming elements 72 and 74 are current steering devices. Essentially, the current between the differential transistors 60 and 62 and the associated programming elements 72 and 74 is determined by the current source 70. Therefore, whenever $V_{in}$ is "0", the current going through to the drain of each of the transistors 60 and 62 is "I". However, the current between the drain between the transistors 60 and 62 and the associated current sources 76 and 78, or 80 and 82, is determined by the programming elements 72 and 74, respectively. For example, if the programming element 72 were configured such that the current level through current source 76 were "0", then the current through current source 78 would be "I". The transconductance of overall stage would then be $G_m$. However, if the programming element 72 were selected such that a portion of the current supplied to the drain of transistor 60 were provided by current source 76, then the effective transconductance $G_{meff}$ of the overall stage would be equal to the fraction of the current diverted to current source 76, "a" multiplied by the transconductance of the differential pair of transistors 60 and 62, $G_{mo}$, as follows:

$$G_{meff} = (a * G_{mo})$$

Therefore, the programming elements 72 and 74 determine the value of "a". This, of course, is determined by an analog voltage, as will be described hereinbelow.

Figure 4:
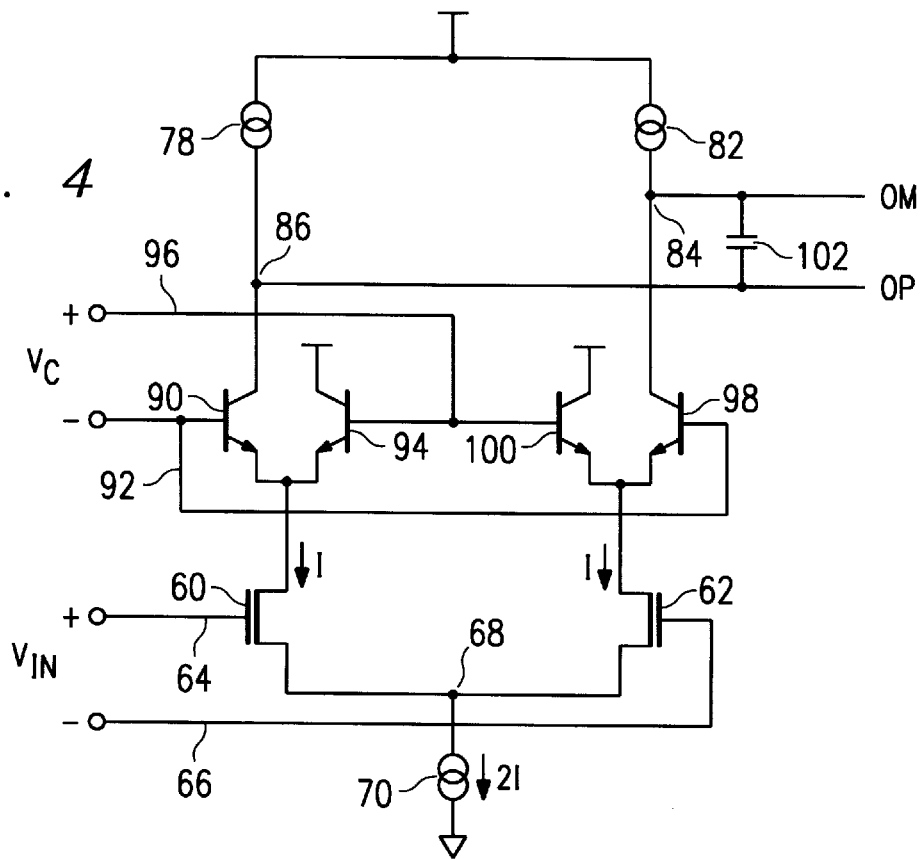
FIG. 4 illustrates a more detailed schematic diagram of the transconductor of FIG. 3.

Referring now to FIG. 4, there is illustrated a more detailed schematic diagram of the transconductor of FIG. 3, illustrating a detail of the programming elements 72 and 74. In general, the programming element 72 and 74 are realized with a current steering Gilbert Quad. This is described in Richetta, R. A., et al, "A 16 MB/s PRML Read/Write Data Channel", ISSCC Digest of Technical Papers, pp. 78–79, February 1995, which is incorporated herein by reference. The programming element 72 is comprised of an NPN bipolar transistor 90 having the collector thereof connected to node 86, the emitter thereof connected to the drain of transistor 60 and the gate thereof connected to the positive control voltage on a line 92, the positive side of the voltage $V_c$. A second NPN bipolar transistor 94 is provided having the collector thereof connected to the positive rail, the emitter thereof connected to the drain of transistor 60 and the base thereof connected to a negative terminal 96 for the voltage $V_c$. The programming element 74 is comprised of two NPN bipolar transistors, an NPN bipolar transistor 98 and an NPN bipolar transistor 100. Transistor 98 has the collector thereof connected to the node 84, the emitter thereof connected to the drain of the transistor 62 and the base thereof connected to the positive terminal 92. The transistor 100 has the collector connected to the positive rail, the emitter thereof connected to the drain of transistor 62 and the base thereof connected to the negative terminal 96. Therefore, it can be seen that the relative voltages between the bases of transistors 90 and 94 or the bases of the transistors 98 and 100 will determine the impedance of the path therethrough. If the voltage on the node 92 is higher than the voltage on the node 96, transistor 90 will conduct and transistor 94 will be turned off, such that the current source 78 will supply all the current to the drain of transistor 60, this being the current "I". When the voltages are essentially equal, the current will be equally shared thereby. In addition, there is represented a load capacitor 102 disposed between the node 84 and the node 86, this being a conventional way to load the output. In general, the transconductance is a function of both the transconductance of the differential transistor 60 and 62, which comprises the transconductance element of the overall stage and the properties of the bipolar devices that comprise the programming elements 72 and 74. The relationship is as follows:

$$G_m = 2 * \sqrt{I_{Bias} K \frac{W}{L}} \tanh\left(\frac{V_c}{2V_T}\right)$$

Where:
$V_T$ is the thermal voltage of the bipolar transistors;
W/L is the width-to-length ratio of transistors 60 and 62;
K is the transconductance factor of 60 and 62; and
$I_{Bias}$ is the current through current source 70.
It can be seen that by adjusting the current through current source 70, the $G_m$ value for the overall transconductance of the stage can be varied.

Figure 5:
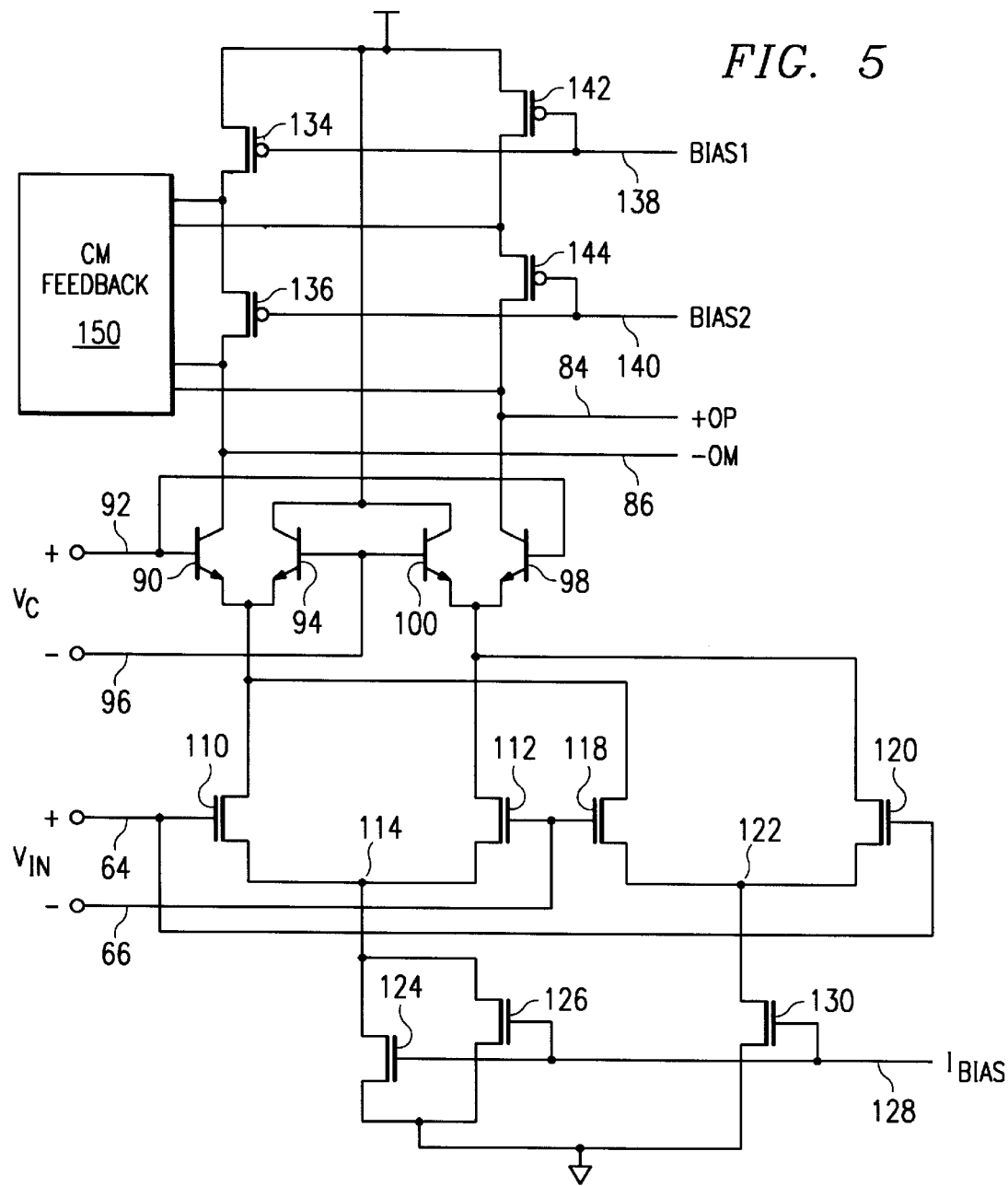
FIG. 5 illustrates the preferred embodiment of the transconductor of FIGS. 3 and 4.

Referring now to FIG. 5, there is illustrated a detailed schematic diagram of the transconductor of the preferred embodiment. The transconductance portion of the transconductor is provided by two sets of differential N-channel MOS transistors. There are two differential N-channel transistors 110 and 112 having the sources thereof connected to a common source node 114 and the gate of transistor 110 connected to the positive input node 64 and the gate of transistor 112 connected to the negative input node 66. The drain of transistor 110 is connected to the commonly coupled emitters of transistors 90 and 94 and the drain of transistor 112 is connected to the commonly connected emitters of transistors 98 and 100. A second pair of N-channel MOS transistors 118 and 120 are provided, having the sources thereof connected to a common source node 122, and the gate of transistor 118 connected to the negative input node 66 and the gate of transistor 120 connected to the positive input node 64. The drain of transistor 118 is connected to the commonly connected emitters of transistors 90 and 94 and the drain of transistor 120 is connected to the commonly connected emitters of transistors 98 and 100.

The differential transistor pair of transistors 110 and 112 provides a current path through the common source node 114 through an N-channel transistor 124 to ground, the gate of transistor 124 connected to a bias line 128, which bias line receives a bias voltage from an external source, this being the control input for the error amplifier 46. Similarly, the node 122 is connected through the source/drain path of an N-channel transistor 130 to ground, the gate thereof connected to the $I_{Bias}$ line 128.

The reason for the use of the two sets of differential transistors is to provide a more linear response. The transistors are sized different with the transistors 110 and 112 having a width-to-length ratio (W/L) of 200:1 and the transistors 118 and 120 having a W/L ratio of 100:1. The current source transistor 124 has a W/L ratio of 680:2, with the transistor 130 having a W/L ratio of 136:2. It can therefore be seen that twice the current will go through node 114 than through node 122 and the associated transistors. The transconductance for the overall structure will be the difference between the transconductance of the two differential pairs. This is described in Khorramabadi, H., P. R. Gray, "High-Frequency CMOS Continuous-Time Filters", IEEE J. Solid-State Circuits, vol. SC-19, pp. 939–948, December 1984, which is incorporated herein by reference.

The active load associated with the collector of transistor 90 and represented by the current source 78 in FIGS. 3 and 4 is comprised of two series connected P-channel transistors 134 and 136, with the source of transistor 134 connected to the positive rail and the drain thereof connected to the source of transistor 136, the drain of transistor 136 connected to the collector of transistor 90. The gate of transistor 134 is connected to a line 138 associated with a bias signal BIAS1 and the gate of transistor 136 associated with a bias line 140 connected to a bias signal BIAS2. This effectively sets the bias conditions for these two transistors 134 and 136. Similarly, the active load associated with the collector of transistor 98 corresponding to the current source 82 in FIGS. 3 and 4 is comprised of two series connected P-channel transistors 142 and 144, transistor 142 having the source thereof connected to the positive rail, the drain thereof connected to the source of transistor 144 and the drain of transistor 144 connected to the collector of transistor 98. The gate of transistor 142 is connected to the bias line 138 and the gate of transistor 144 is connected to the bias line 140.

A common mode feedback circuit 150 is provided and is connected between the drain of transistor 134 and source of transistor 136 and the drain of transistor 142 and the source of transistor 144. The common mode feedback circuit 150 is not illustrated in detail, but effectively sets the common mode bias by providing a current path from the drain of transistor 134 which will affect the current that flows through transistor 136, this also occurring in a similar manner with respect to transistors 142 and 144.

Figure 6:
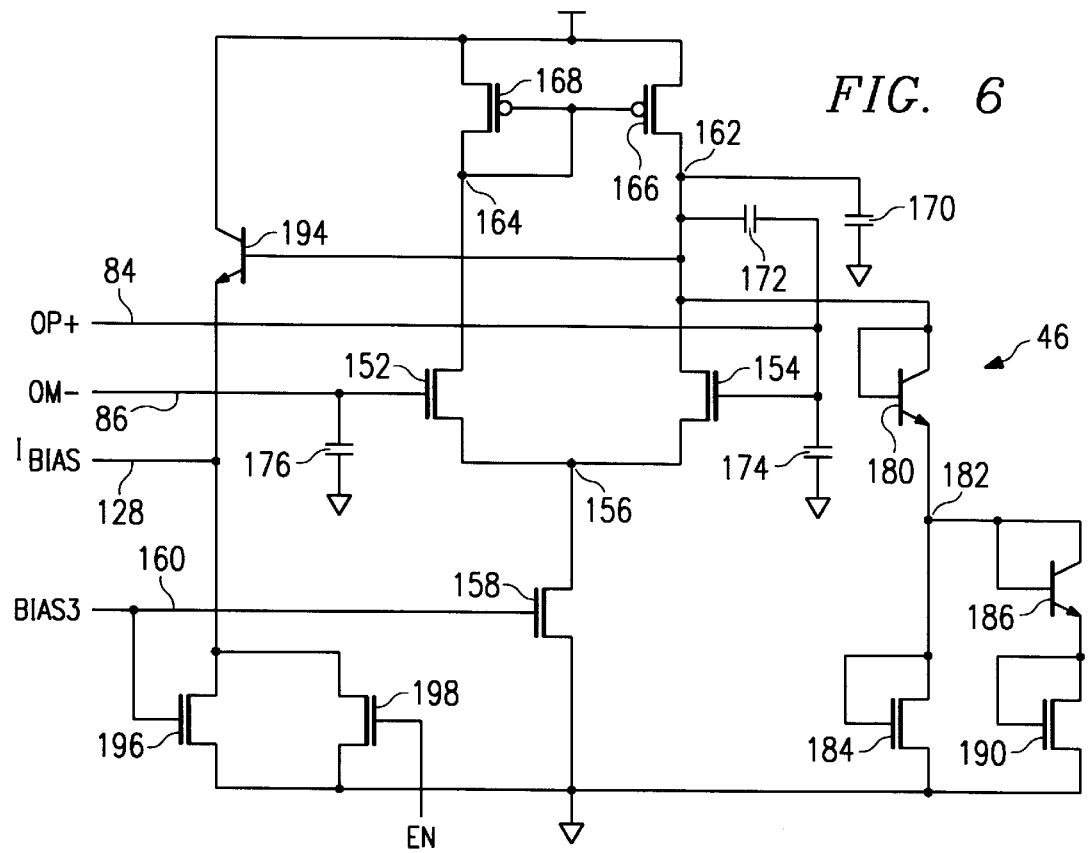
FIG. 6 illustrates a schematic diagram of the error amplifier utilized in the fast tuning loop.

Referring now to FIG. 6, there is illustrated a detailed schematic diagram of the error amplifier 46. The error amplifier 46 is a differential amplifier comprised of two input differential N-channel transistors 152 and 154 having the sources thereof connected to a common source node 156, the gate of transistor 152 connected to the negative output terminal 86 of the transconductor and the gate of transistor 154 connected to the positive output terminal 84 from the transconductor. A current source from common source node 156 is provided with an N-channel transistor 158 having the drain thereof connected to node 156, the source thereof connected to ground and the gate thereof connected to a bias terminal 160 that receives a bias signal BIAS3. The BIAS3 signal is connected to an external current source which is mirrored to the gate of transistor 158. This is similar with respect to the bias signals BIAS1 and BIAS2, they being derived from a current mirror circuit.

The drain of transistor 154 is connected to a node 162 and the drain of transistor 152 is connected to a node 164. Node 162 is connected to the drain of a P-channel transistor 166, the source thereof connected to the positive supply terminal. The gate of transistor 166 is connected to the node 164, with node 164 connected to the drain of a P-channel transistor 168. Transistor 168 has the source thereof connected to the positive supply terminal and the gate thereof connected to the node 164. The node 162 is connected to one side of a 1.5 pf capacitor 170, the other side thereof connected to ground. Additionally, a feedback capacitor 172 having a value of 1.5 pf is connected between the node 162 and the gate of transistor 154 on the positive output terminal 84 of the transconductor. A 10.0 pf capacitor 174 is connected between the gate of transistor 154 and ground. The capacitors 170, 172 and 174 provide for the stability of the feedback loop. An additional capacitor 176 having a value of 10.0 pf is also connected between the gate of transistor 152 and ground.

The node 162 is connected to the collector and base of a diode configured NPN bipolar transistor 180, the emitter thereof connected to a node 182. Node 182 is connected to a diode configured N-channel transistor 184 having the source thereof connected to ground and the gate and drain thereof connected to the node 182. Node 182 is also connected to the base and collector of a diode configured NPN bipolar transistor 186, the emitter thereof connected to the drain and gate of a diode configured N-channel transistor 190, the source thereof connected to ground. The node 162 provides the output of the error amplifier. The output of the error amplifier on node 162 is connected to the gate of an NPN bipolar transistor 194, the collector thereof connected to the positive supply terminal and the emitter thereof connected to the $I_{Bias}$ node 128. Node 128 is also connected to the drain of an N-channel transistor 196, the gate thereof connected to the bias node 160. An enable transistor 198 is connected such that the source/drain path thereof is connected between the $I_{Bias}$ terminal and ground with the gate thereof connected to an enable signal. When the enable signal is low, then the bias current on node 128 will be provided. It is noted that the bias level on node 128 is varied as a function of the input voltage between the input nodes 84 and 86.

Figure 7:
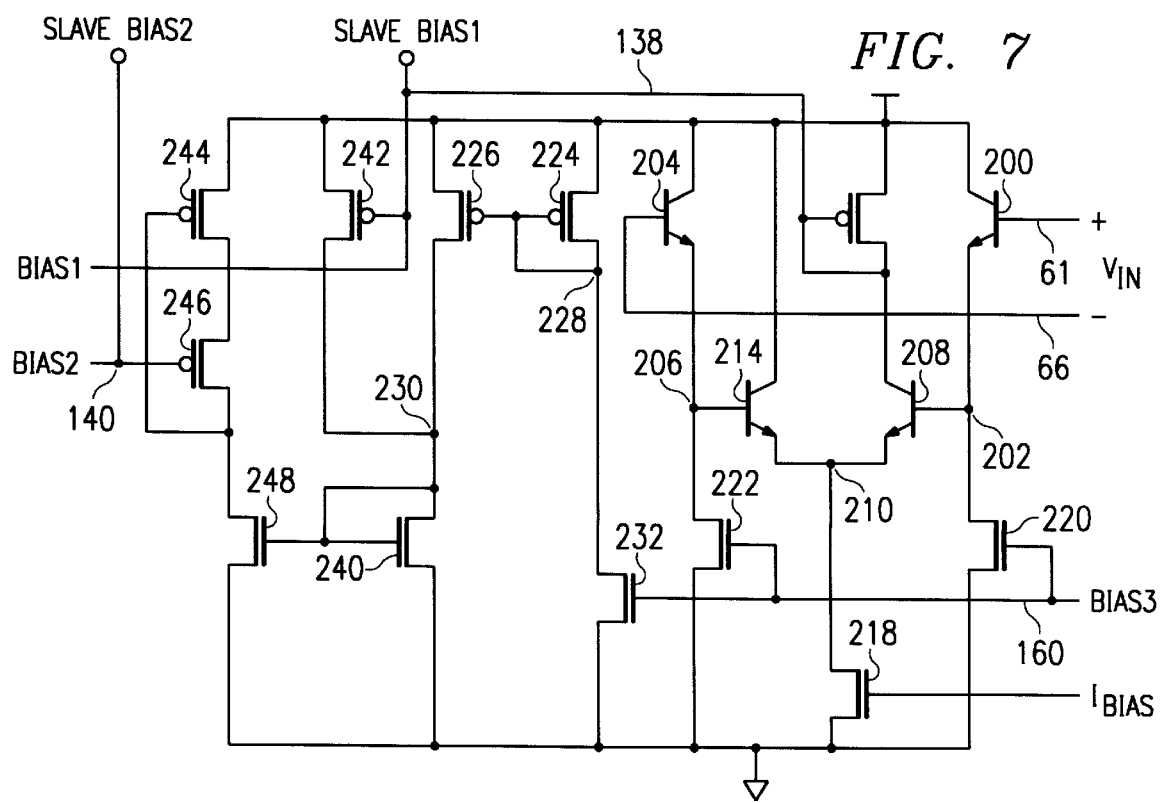
FIG. 7 illustrates a schematic diagram of the bias circuit for biasing the active loads.

Referring now to FIG. 7, there is illustrated a schematic diagram of the bias circuit for biasing the active loads. The input voltage $V_{in}$ on the lines 64 and 66 are input to a bipolar circuit. The positive input terminal 64 is connected to the base of a bipolar transistor 200, the emitter thereof connected to a node 202 and the collector thereof connected to the positive supply rail. The negative terminal 66 is connected to the base of an NPN transistor 204, the emitter thereof connected to a node 206 and the collector thereof connected to a positive terminal. The node 202 is connected to the base of an NPN transistor 208, the emitter thereof connected to a common emitter node 210 and the collector thereof connected to the node 138, this being an external terminal labeled SLAVE BIAS1, this being a signal that is to provide the BIAS1 signal for the active loads in the transconductor for both the transconductor in the master stage and in the slave stages. The node 206 is also connected to the base of an NPN transistor 214, the emitter thereof connected to the node 210 and the collector thereof connected to the positive supply terminal. Node 210 is connected to the drain of an N-channel transistor 218, the source thereof connected to ground and the gate thereof connected to the $I_{Bias}$ signal received from the error amplifier 46. The node 202 is connected to the drain of an N-channel transistor 220, the source thereof connected to ground and the gate thereof connected to the BIAS3 current level on the node 160. Node 206 is connected to the drain of an N-channel transistor 222, the source thereof connected to ground and the gate thereof connected to the BIAS3 node 160.

A current source is provided with two P-channel transistors 224 and 226, transistor 224 having the source thereof connected to the power supply terminal and the drain and gate thereof connected to a node 228 with transistor 226 having the source thereof connected to the power supply terminal, the gate thereof connected to node 228 and the drain thereof connected to a node 230. Node 228 is connected to the drain of an N-channel transistor 232, the source thereof connected to ground and the gate thereof connected to the BIAS3 node 160. Node 230 is connected to the drain and gate of an N-channel transistor 240, the source thereof connected to ground. A P-channel transistor 242 has the source thereof connected to the power supply terminal, the gate thereof connected to the BIAS1 node 138 and the drain thereof connected to the node 230. Two P-channel transistors 244 and 246 are connected in series, with the source/drain paths thereof connected between the power supply terminal and the drain of an N-channel transistor 248, the gates of the P-channel transistor 244 connected to the BIAS2 node 140 and also to the drain of an N-channel transistor 248. The N-channel transistor 248 has the source thereof connected to ground and the gate thereof connected to the gate of transistor 240. The node 140 also provides the external BIAS2 signal to the slaves.

In summary, there has been provided a transconductor having a transconductor element that is comprised of two differentially connected MOS transistors. Active loads are provided for the MOS transistors with a steering circuit provided therebetween which is programmable to program the effective transconductance of the overall stage. The transconductance value is adjusted with a fast tuning loop. This is provided by providing a fixed voltage on the input to the transconductor and then offsetting the current on the output thereof by a programmable current source, such that the design current output will be effectively a zero value. This is input to an error amplifier which develops an error voltage. For variations in the transconductance, this error voltage is fed back to a tuning input to tune the transconductance of the transconductance element to minimize this error.

Although the preferred embodiment has been described in detail, it should be understood that various changes, substitutions and alterations can be made therein without departing from the spirit and scope of the invention as defined by the appended claims.

What is claimed is:

1. A method for compensating the transconductance of a programmable transconductor, comprising the steps of:

providing a transconductance element having a differential input and a current output and a control element associated therewith that allows the transconductance of the transconductance element to be varied in response to receiving an error signal;

programming the bandwidth of the transconductor by diverting current from the output of the transconductance element, the amount of current diverted being a function of an external program signal;

connecting a programmable current source to the output of the transconductance element after current is diverted thereby by the step of programming, the current source level programmable in response to receiving an external current program signal;

applying a fixed voltage to the input of the transconductance element;

determining the error between the relationship $I_P/B_N$ and the $I_O/V_N$ and generating the error signal; and inputting the error signal to the control element of the transconductance element and varying the transconductance thereof.

2. The method of claim 1, wherein the external current program signal and the external bandwidth program signal are varied in tandem such that the transconductance of the transconductance element is varied at the same time that the bandwidth is varied.

* * * * *

UNITED STATES PATENT AND TRADEMARK OFFICE
CERTIFICATE OF CORRECTION

PATENT NO.   : 5,912,583
DATED        : June 15, 1999
INVENTOR(S)  : Richard C. Pierson, et. al.

It is certified that error appears in the above-identified patent and that said Letters Patent is hereby corrected as shown below:

Title page, item [75] inventors: the third inventor's name should be spelled as following: Venkatraman.

Title page, item [60] insert the following after "Related U. S. Application Data":
Provisional application No. 60/034,593 Jan. 2, 1997

Column 1, line 5, insert the following:

--CROSS REFERENCE TO RELATED APPLICATION
    Reference is made to and priority claimed from U.S. provisional application Ser. No.
    60/034,593, filed Jan. 2, 1997, entitled CONTINUOUS TIME FILTER WITH PROGRAMMABLE BANDWIDTH AND TUNING LOOP--

Signed and Sealed this

Sixteenth Day of May, 2000

*Attest:*

Q. TODD DICKINSON

*Attesting Officer*         *Director of Patents and Trademarks*